United States Patent [19]
Memida

[11] Patent Number: 5,721,563
[45] Date of Patent: Feb. 24, 1998

[54] ACTIVE MATRIX LIQUID CRYSTAL DRIVE CIRCUIT CAPABLE OF CORRECTING OFFSET VOLTAGE

[75] Inventor: Yuuichi Memida, Nara-ken, Japan

[73] Assignee: Sharp Kabushiki Kaisha, Osaka, Japan

[21] Appl. No.: 590,578

[22] Filed: Jan. 24, 1996

[30] Foreign Application Priority Data

Feb. 20, 1995 [JP] Japan ............................ 7-030866
Oct. 18, 1995 [JP] Japan ............................ 7-269572

[51] Int. Cl.$^6$ ............................................ G11C 27/02
[52] U.S. Cl. ............................ 345/98; 327/94; 327/95; 327/96
[58] Field of Search ........................ 345/98; 327/94, 327/95, 96; 349/34, 151

[56] References Cited

U.S. PATENT DOCUMENTS

| | | | |
|---|---|---|---|
| 4,439,693 | 3/1984 | Lucas et al. | 327/95 |
| 4,779,012 | 10/1988 | Moscovici | 327/95 |
| 5,283,477 | 2/1994 | Shibata | 345/98 X |
| 5,304,866 | 4/1994 | Uranaka | 327/94 X |
| 5,341,037 | 8/1994 | Miki et al. | 327/96 |
| 5,353,135 | 10/1994 | Edwards | 349/34 |
| 5,408,142 | 4/1995 | Takatori et al. | 327/94 X |
| 5,459,483 | 10/1995 | Edwards | 345/98 |
| 5,467,035 | 11/1995 | Ohi et al. | 327/96 X |
| 5,506,526 | 4/1996 | Seesink | 327/94 X |

FOREIGN PATENT DOCUMENTS 456888  2/1992  Japan .

Primary Examiner—Raymond J. Bayerl
Assistant Examiner—Seth D. Vail

[57] ABSTRACT

An active matrix liquid crystal drive circuit comprising an input-signal storage capacitor for storing an analog input signal, a differential amplifier which alternately presents a first operative state in which the output thereof is returned to the inverting input terminal thereof in a negative feedback manner and a second operative state in which the output is returned to the non-inverting input terminal thereof through a polarity inverting output buffer circuit in a negative feedback manner, and an output-voltage storage capacitor for storing an output voltage of the differential amplifier. In the first operative state, the voltage stored in the input-signal storage capacitor is applied to the non-inverting input terminal, and the output voltage which is returned to the inverting input terminal in a negative feedback manner is stored in the hold capacitor. In the second operative state, the voltage of the output-voltage storage capacitor is applied to the inverting input terminal and the output of the buffer circuit is output as a liquid crystal drive voltage.

6 Claims, 12 Drawing Sheets

ACTIVE MATRIX LIQUID CRYSTAL DRIVE CIRCUIT CAPABLE OF CORRECTING OFFSET VOLTAGE

BACKGROUND OF THE INVENTION

1. Field of the Invention

The present invention relates to an active matrix liquid crystal drive circuit, and more particularly to a liquid crystal drive circuit which drives a thin-film transistor (TFT) liquid crystal display through a differential amplifier.

2. Description of the Related Art

FIG. 2 shows a liquid crystal display system including a TFT liquid crystal display and a drive circuit for the display. Each. pixel, PX, of the TFT liquid crystal display LP consists of a liquid crystal device P and a thin-film transistor (TFT) T. The gates of the TFTs of the pixels PXs on the same row are connected in common, and are connected to corresponding output terminals $G_1, \ldots, G_m$ of a gate driver GD, respectively. The sources of the TFTs of the pixels PXs on the same column are connected in common, and are connected to corresponding output terminals $S_1, \ldots, S_m$ of a source driver SD, respectively. The gate driver GD outputs gate drive pulse signals whose phases are shifted in sequence, while the source driver SD outputs an output voltage corresponding to a video signal.

The internal construction of the source driver is shown in FIG. 3. An analog video signal which is input through an input terminal IN is sequentially taken into sample hold circuits $SH_{21}$ by means of sampling control signals whose phases are shifted in sequence. After the analog signal is input to and stored in all the sampling hold circuits, the outputs of the hold circuits are input in parallel to differential amplifiers $OP_{21}$. The outputs of the differential amplifiers are output from the output terminals $OUT_1, \ldots, OUT_n$ and are given to the TFT liquid crystal display. A desired display is performed in the TFT liquid crystal display LP by driving the aforementioned gate driver GD and source driver SD in a time-division manner.

FIG. 4 shows the sampling hold circuit $SH_{21}$ and the differential amplifier $OP_{21}$, which comprise the aforementioned source driver. In the figure, $S_{21}$ and $S_{22}$ denote analog switches, which are turned on by the input of sampling control signals $a_i$ and transmit the input video signals at that time to input-signal storage capacitors $C_{21}$ and $C_{22}$, respectively. The phases of the sampling control signals $a_i$ have been sequentially shifted in correspondence with the sampling hold circuits. $S_{23}$ and $S_{24}$ denote analog switches, and after video signals have been input to and stored in the input-signal storage capacitors $C_{21}$ or $C_{22}$ of all the sample hold circuits, the switches $S_{23}$ and $S_{24}$ are turned on by the input of control signals, c, which are output during one horizontal period. The signals, stored in the input-signal capacitors $C_{21}$ and $C_{22}$, are input to a non-inverting input terminal (+) of the differential amplifier $OP_{21}$. The output terminal of the differential amplifier $OP_{21}$ is connected to the inverting input terminal (−) to constitute a voltage follower circuit. The output voltage of the differential amplifier $OP_{21}$ is output to the liquid crystal display as an output of the source driver SD.

The reason that in FIG. 4 there are provided two sets of an analog switch and a capacitor is that when an output based on the accumulated voltage of one capacitor is being performed during some horizontal period, a signal voltage during the next horizontal period is input to and stored in another capacitor. For instance, when an output based on the voltage of the capacitor $C_{21}$ is being performed during some horizontal period, the analog switch $S_{23}$ is on and the analog switches $S_{21}$ and $S_{24}$ are off. Then, the analog switch $S_{22}$ is turned on when the sampling control signals $a_i$ whose phases are shifted in correspondence with the sample hold circuits are input, and the input signal voltage at that time is transmitted to the capacitor $C_{22}$. Because an output based on the voltage of the capacitor $C_{22}$ is performed for the next horizontal period, the analog switch $S_{24}$ is turned on and the analog switches $S_{22}$ and $S_{23}$ are turned off. Also, the analog switch $S_{21}$ is turned on when the sampling control signal is input, and the input signal voltage at that time is transmitted to the capacitor $C_{21}$. The aforementioned operations are alternately repeated.

The construction of another sample hold circuit other than the sample hold circuit $SH_{21}$ is shown in FIG. 5. In the sample hold circuit of FIG. 4, each of the two capacitors serves as a sampling capacitor and a hold capacitor and the two capacitors are alternately used for odd horizontal periods and even horizontal periods, whereas the sample hold circuit of FIG. 5 differs in that a sampling capacitor $C_{21}'$ and a hold capacitor $C_{22}'$ are separately provided. $S_{21}'$ denotes an analog switch which is turned on by input of the sampling control signal $a_i$ so that an input video signal is transmitted to the sampling capacitor $C_{21}'$. $S_{23}'$ denotes an analog switch which is turned on by the control signal "b" that is output at the time of the start of the horizontal period so that a voltage on the sampling capacitor $C_{21}'$ is transmitted to the hold capacitor $C_{22}'$.

Either construction requires two capacitors per one output.

With the circuit of FIG. 4 or 5, an output voltage with the same level as an input signal is impedance-converted and is output, but if an input offset exists in the differential amplifier $OP_{21}$, then an output voltage whose level has been shifted by an amount of the offset will be output. In addition, if the aforementioned input offsets are different between the differential amplifiers, then the different offsets as they are will become a variation between the output voltages.

FIG. 6 shows a conventional liquid crystal drive circuit in which a circuit for correcting the input offset of the differential amplifier is provided in view of the aforementioned problem.

In FIG. 6, $SH_{21}$ represents a sample hold circuit of the same construction as that shown in FIG. 4 or 5, and $OP_{21}$ represents a differential amplifier. This conventional example is constructed such that the offset of the differential amplifier $OP_{21}$ is removed by newly providing an offset-voltage storage capacitor $C_{23}$ connected to the inverting input terminal (−) of the differential amplifier $OP_{21}$ and providing four analog switches $S_{25}$ to $S_{28}$ for changing a circuit connection. That is, to the non-inverting input terminal (+) of the differential amplifier $OP_{21}$, there are connected the output of the sample hold circuit $SH_{21}$ and the switch $S_{25}$ which connects the non-inverting input terminal with ground. To the inverting input terminal (−) of the differential amplifier $OP_{21}$, there is connected the switch $S_{27}$ which connects the differential amplifier output with the inverting input terminal (−) to form a negative feedback circuit construction and there is connected one end of a capacitor $C_{23}$ in which the offset voltage of the differential amplifier $OP_{21}$ is stored. To the other end of the capacitor $C_{23}$, there are connected the switch $S_{26}$ which connects the capacitor $C_{23}$ with ground and the switch $S_{28}$ which connects the differential amplifier $OP_{21}$ output terminal with the inverting input terminal (−) through the capacitor $C_{23}$ to form a negative feedback circuit construction.

Now, the operation of the conventional liquid crystal drive circuit shown will be described in reference to FIGS. 7 and 8.

Input signals such as video signals are sequentially stored in a time-division manner by a plurality of sample hold circuits $SH_{21}$ incorporated in the liquid crystal drive circuit. The respective input signals stored are transmitted to the differential amplifiers $OP_{21}$ corresponding to the sample hold circuits $SH_{21}$, and the transmitted signals are impedance-converted and are output.

The operation of this conventional circuit becomes a circuit construction shown in FIG. 7 by turning the switches $S_{25}$ to $S_{27}$ on and the switch $S_{28}$ off. The non-inverting input terminal (+) is connected to ground, and an input signal voltage to the non-inverting input terminal (+) goes to a ground level (0 V). At this time, the offset voltage of the differential amplifier occurs in the output terminal and the inverting input terminal (−), and the offset voltage is stored in the capacitor $C_{23}$, connected at one end thereof to the inverting input terminal and at the other end to ground. Then, by turning the switches $S_{25}$ to $S_{27}$ off, the switch $S_{28}$ on, and the output side switch of the sample hold circuit on, the circuit shown in FIG. 6 becomes a negative feedback circuit construction such as that in FIG. 8, in which the input signal stored in the capacitor of the sample hold circuit is transmitted to the non-inverting input terminal of the differential amplifier and the inverting input terminal is connected to the output terminal through the capacitor $C_{23}$ where the offset voltage has been stored.

With the above arrangement, there is performed a negative feedback operation. That is, the potential of the input signal transmitted to the non-inverting input terminal by the sample hold circuit $SH_{21}$ becomes equal to the potential on the inverting input terminal. In practice a potential difference of the offset voltage of the differential amplifier occurs across both the input terminals, and the circuit becomes stable. At this time, in the output terminal of the differential amplifier, the offset voltage stored in the capacitor $C_{23}$, connected between the output terminal and the inverting input terminal, is subtracted from the non-inverting input terminal voltage, and consequently, the offset voltage in each differential amplifier is corrected.

In the aforementioned conventional liquid crystal drive circuit, the input signals are stored in a time-division manner by a plurality of sample hold circuits, and the stored input signals are output to the pixels of the liquid crystal panel by a plurality of differential amplifiers, respectively. For this reason, as a means for correcting the offset voltages of the differential amplifiers and reducing fluctuations of the outputs of a plurality of output circuits, each circuit is constructed such that the offset voltage that occurs in the differential amplifier of each output circuit is stored in a capacitor to correct the output voltage with respect to the non-inverting input. Therefore, the capacitor for storing and correcting the offset voltage becomes necessary for each output circuit, and a liquid crystal drive circuit uses a plurality of output circuits, as shown in FIG. 3. The number of the output circuits is usually about 100 to 300, and an increase in the area of an integrated circuit by the capacitors causes a cost increase. The offset voltage occurs because of the fluctuations of the circuit constructions of the differential amplifiers and the fluctuations of element characteristics, and the voltage width of the offset voltage varies at any time in correspondence with the input voltage level. Therefore, in an offset correction means such as the conventional circuit in which the offset voltage correction is made by the setting of switches when the input signal voltage is fixed to the ground level (0 V), the offset voltage correction cannot be made in correspondence with a variation in the input voltage level.

SUMMARY OF THE INVENTION

The present invention has been made in order to solve problems such as described above. Accordingly, it is the objective of the present invention to realize an active matrix liquid crystal drive circuit which is capable of correcting an offset voltage in correspondence with an input voltage level in an operating range and is provided with a function of reducing the fluctuations of the outputs of a plurality of output circuits, at low cost without increasing the area of the integrated circuit.

The above object is accomplished in accordance with one aspect of the present invention by providing an active matrix liquid crystal drive circuit which comprises: a sampling capacitor for storing an analog input signal; a buffer circuit for inverting a polarity of an input signal thereof; a differential amplifier having an inverting input terminal, a non-inverting input terminal and an output terminal connected to an input of said buffer circuit; a hold capacitor connected to said inverting terminal of said differential amplifier; and switching means, in a first operative state, for connecting said sampling capacitor with said non-inverting input terminal and connecting said output of said differential amplifier with said hold capacitor, and in a second operative state, for disconnecting said sampling capacitor with said non-inverting input terminal and connecting an output of said buffer circuit with an output terminal of said liquid crystal drive circuit.

The foregoing object is also accomplished in accordance with another aspect of the present invention by providing an active matrix liquid crystal drive circuit which comprises: a sampling capacitor for storing an analog input signal; a buffer circuit for inverting a polarity of an input signal thereof; a differential amplifier having an inverting input terminal, a non-inverting input terminal and an output terminal connected to an input of said buffer circuit; a hold capacitor connected to said non-inverting terminal of said differential amplifier; and switching means, in a first operative state, for connecting said sampling capacitor with said inverting input terminal and connecting an output of said buffer circuit with said hold capacitor, and in a second operative state, for disconnecting said sampling capacitor with said inverting input terminal and connecting said output terminal of said differential amplifier with an output terminal of said liquid crystal drive circuit.

According to the present invention, there is no need of providing another capacitor for correcting an offset voltage in addition to a hold capacitor and a sampling capacitor, since the hold capacitor serves as a capacitor for correcting an offset voltage. Therefore, in integration to a chip, the size of the chip is not increased. Further, it is enable to correct an offset voltage in accordance with an input voltage level.

Consequently, it is possible to provide a liquid crystal drive circuit having high accuracy, high stability and high display quality with low cost.

Further objects and advantages of the present invention will be apparent from the following description of the preferred embodiments of the invention as illustrated in the accompanying drawings.

DESCRIPTION OF THE PREFERRED EMBODIMENTS

A preferred embodiment of the present invention will hereinafter be described in reference to the accompanying drawings.

Figure 1:
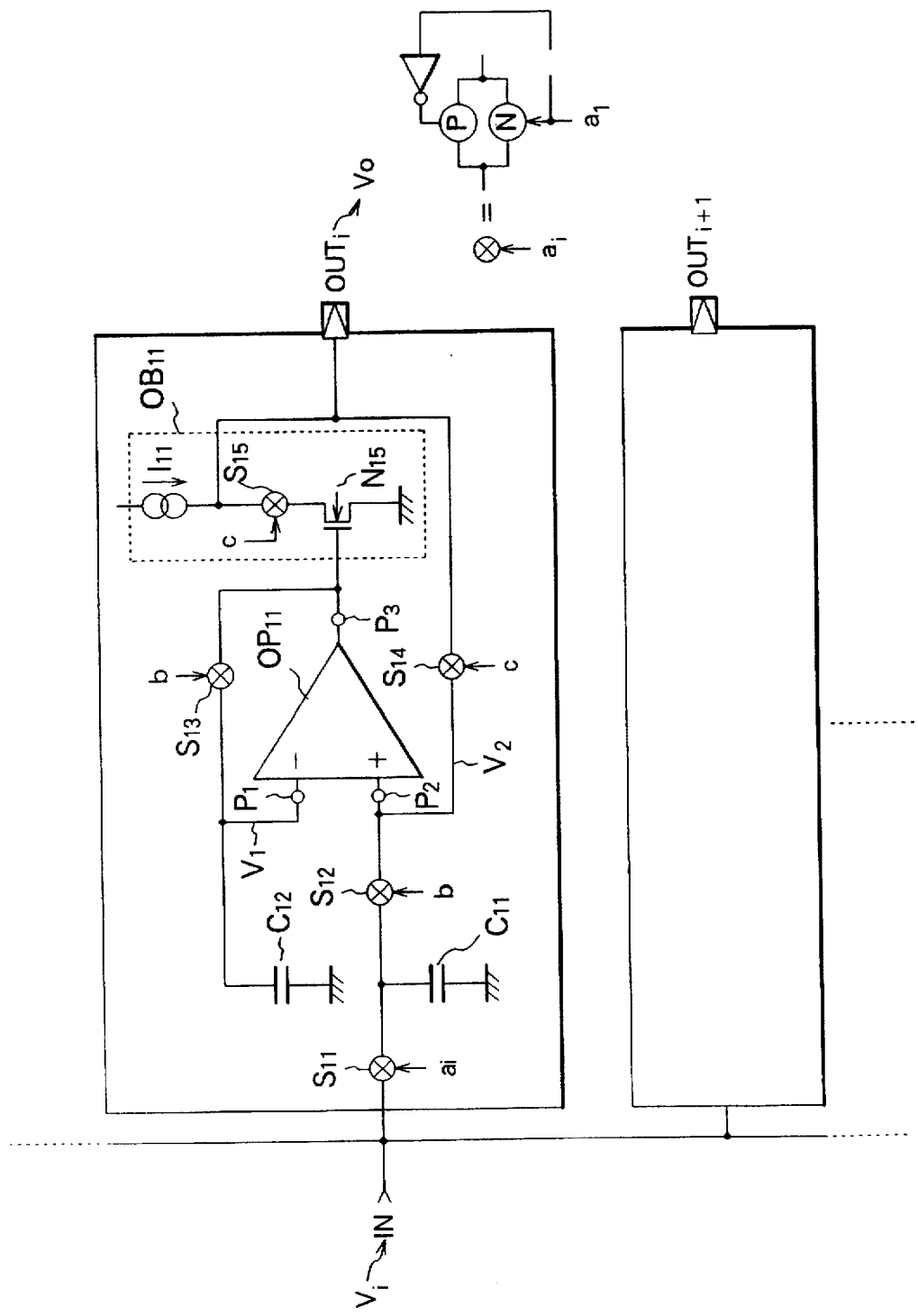
FIG. 1 is a schematic view showing a first embodiment of the present invention.
Figure 2:
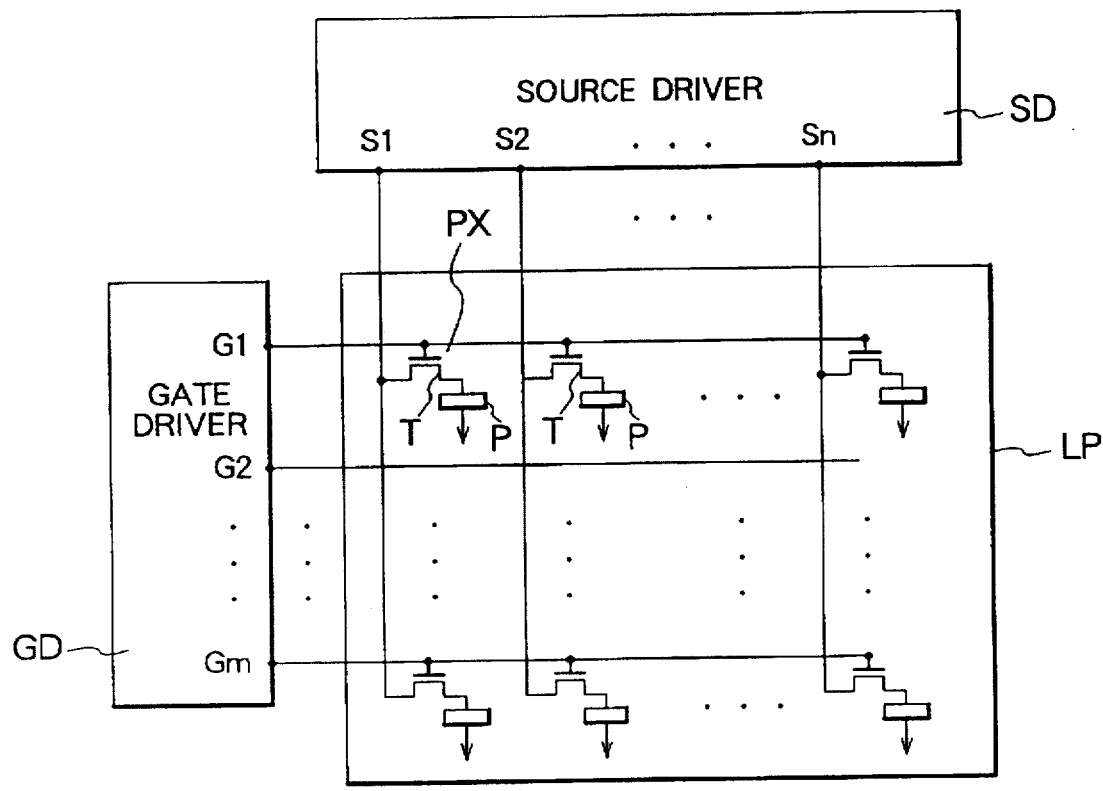
FIG. 2 is a block diagram showing a liquid crystal display system.
Figure 3:
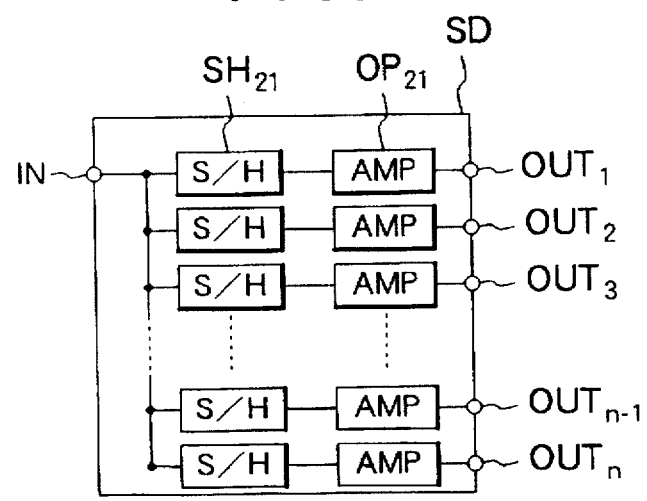
FIG. 3 is a block diagram showing the source driver of FIG. 2.
Figure 4:
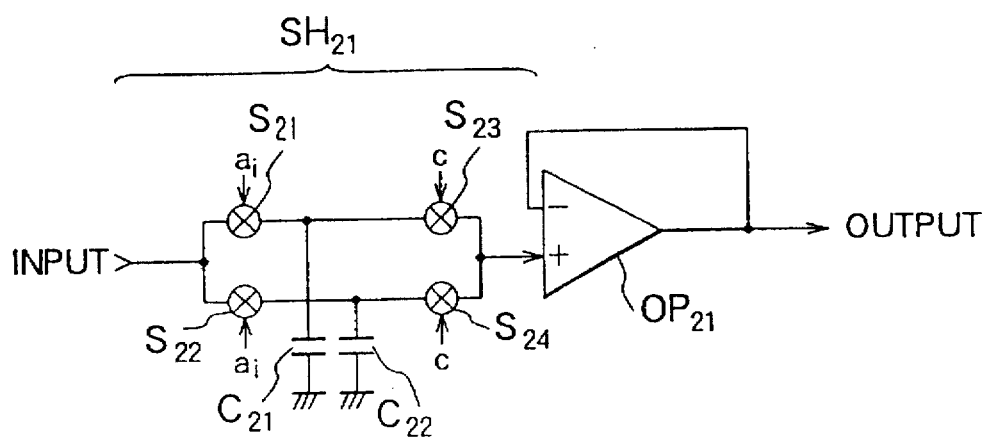
FIG. 4 is a schematic view showing the sample hold circuit and the differential amplifier which constitute the source driver.
Figure 5:
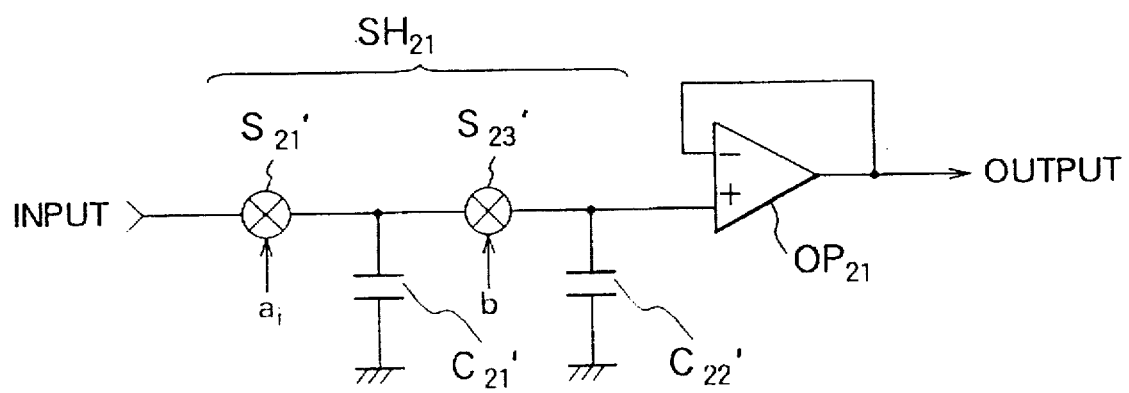
FIG. 5 is a schematic view showing another construction of the sample hold circuit.
Figure 6:
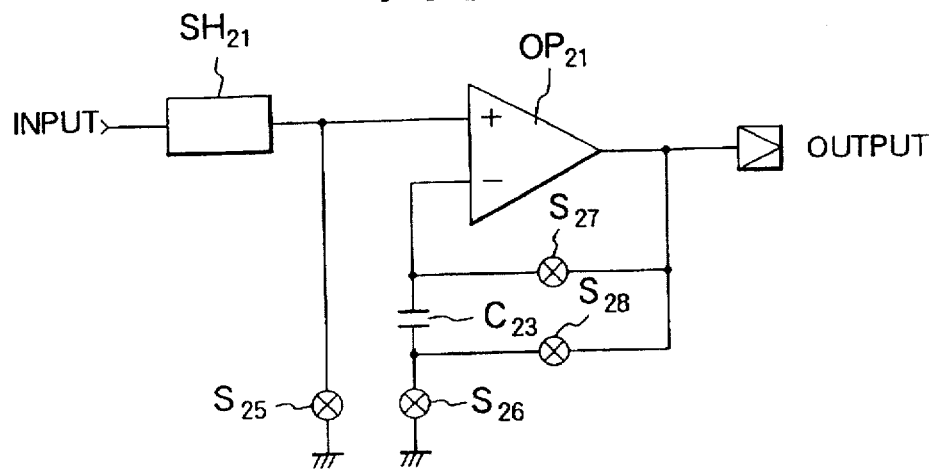
FIG. 6 is a schematic view showing a conventional liquid crystal drive circuit.
Figure 7:
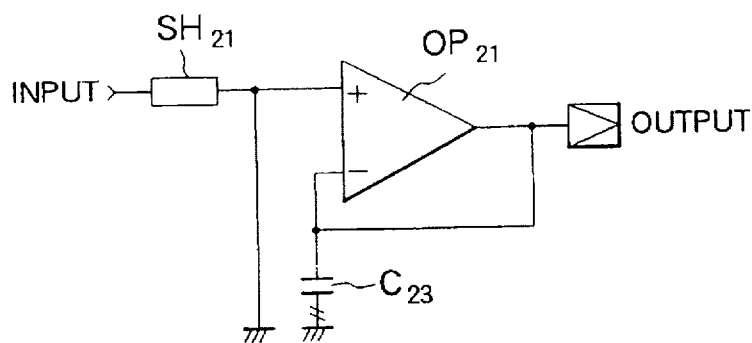
FIG. 7 is a diagram used to explain the operational principles of the liquid crystal drive circuit of FIG. 6.
Figure 8:
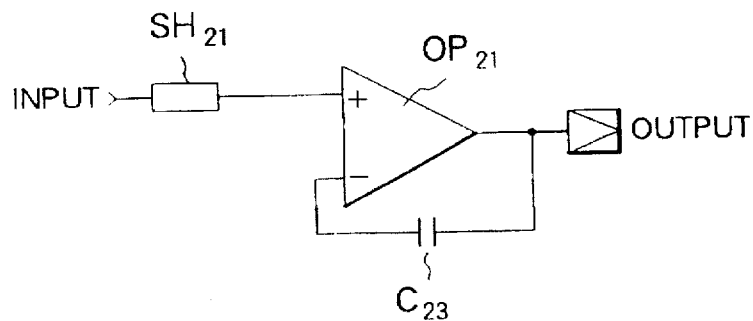
FIG. 8 is a diagram used to explain the operational principles of the liquid crystal drive circuit of FIG. 6.

FIG. 1 shows a first embodiment of the present invention. One of the output terminals of a source driver is shown, and the same circuit construction is provided every output terminal.

The active matrix liquid crystal drive circuit of this embodiment, as shown in FIG. 1, is provided with an input-signal storage capacitor $C_{11}$ for storing an input signal in a time-division manner, a time-division storage control switch $S_{11}$ for performing time-division control of input-signal storage, a differential amplifier $OP_{11}$ for impedance-converting and outputting the input signal stored in the input-signal storage capacitor $C_{11}$, an output voltage storage capacitor $C_{12}$ for storing an output voltage in a primary operation including an offset voltage of the differential amplifier $OP_{11}$, and a current source $I_{11}$ and an NMOS transistor $N_{15}$ which constitute an output-polarity inverting buffer circuit $OB_{11}$ for switching a construction of a negative feedback circuit including the differential amplifier $OP_{11}$.

Reference character IN denotes an input terminal for inputting an analog signal $V_i$, $OUT_i$ denotes an output terminal for outputting a liquid crystal drive circuit output $V_0$ to the liquid crystal panel, $V_1$ denotes a terminal voltage on the inverting input terminal $P_1$ of the differential amplifier $OP_{11}$ that is returned in the primary operative state from the output of the differential amplifier, and $V_2$ denotes a terminal voltage on the non-inverting input terminal $P_2$ of the differential amplifier $OP_{11}$ that is returned in the secondary operative state from the output of the differential amplifier through the output-polarity inverting buffer circuit $OB_{11}$.

Figure 9:
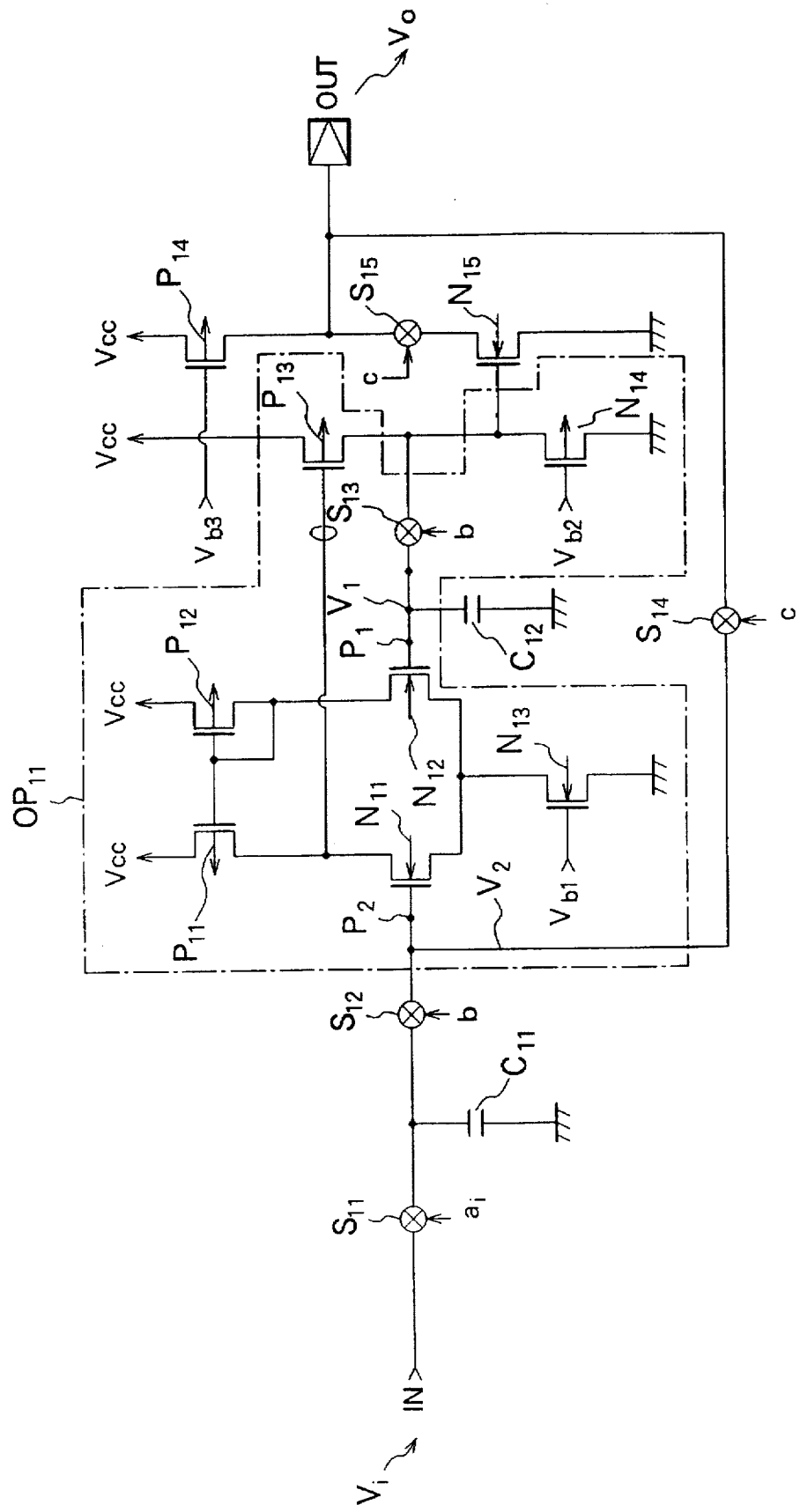
FIG. 9 is an internal equivalent circuit diagram of the differential amplifier used in the liquid crystal drive circuit of the present invention.

Note that the differential amplifier $OP_{11}$ can be constituted by PMOS transistors $P_{11}$ to $P_{13}$, NMOS transistors $N_{11}$ to $N_{14}$, and a switch $S_{13}$, as shown in FIG. 9.

Now, the operation of the differential amplifier will be described with FIG. 9.

FIG. 9 shows the basic internal circuit of the differential amplifier $OP_{11}$ used in this embodiment. For the operation of the differential amplifier $OP_{11}$, the current flowing through the transistor $N_{11}$ is controlled by the non-inverting input terminal $P_2$, and the current flowing through the current mirror circuit constituted by the transistors $N_{12}$, $P_{11}$, and $P_{12}$ is controlled by the inverting input terminal $P_1$, thereby changing the current that flows through the output transistor $P_{13}$. More specifically, when the input voltage on the non-inverting input terminal $P_2$ is higher than that on the inverting input terminal $P_1$, the current which flows through the output transistor $P_{13}$ is increased. When, on the other hand, the input voltage on the non-inverting input terminal $P_2$ is lower than that on the inverting input terminal $P_1$, the current which flows through the output transistor $P_{13}$ is decreased. The current that flows through the output transistor $P_{13}$ is compared with a load current that flows through the transistor $N_{14}$ to which a bias voltage $N_{b2}$ is input, and the output voltage is changed. By connecting this output section to the inverting input terminal $P_1$, the negative feedback operation is performed so that the voltage on the non-inverting input terminal $P_2$ and the voltage on the inverting input terminal $P_1$ become equal to each other.

Next, the operation of the circuit in this embodiment will be described in detail.

The liquid crystal drive circuit in the present invention is constructed such that an analog signal such as a video signal is input as an input signal, the input signal is stored in a time-division manner, the stored input signal is impedance-converted by the output circuit, and then the converted signal is output in correspondence with each of the pixels on the horizontal line of the liquid crystal panel. Thus, the basic circuit operation is the same as the conventional circuit.

Figure 10:
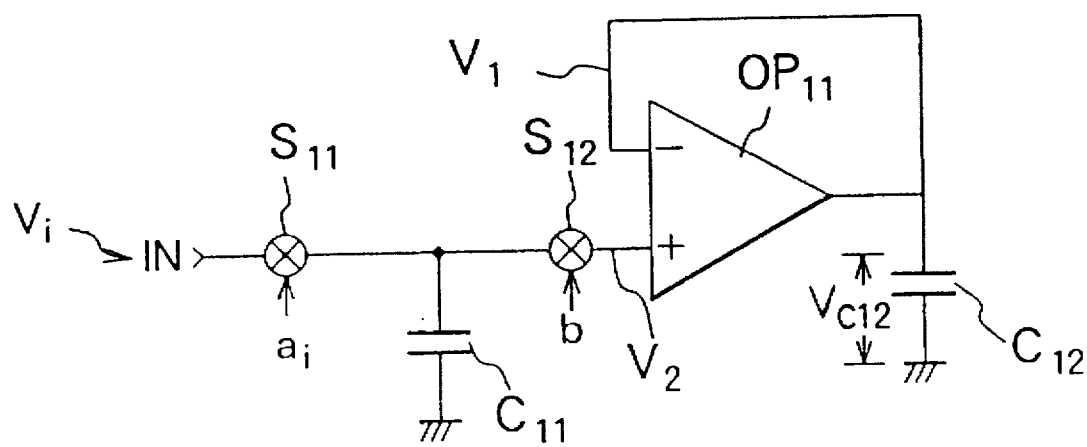
FIG. 10 is a diagram used to explain the operational principles of the liquid crystal drive circuit of FIG. 1.

In this embodiment of the present invention, a plurality of switches in the liquid crystal drive circuit which are equivalent to the switch $S_{11}$ are turned on for a fixed period by a time-division operation, and an input signal $V_i$ is sequentially stored in a plurality of capacitors corresponding to the switches in a time-division manner. After the input signal $V_i$ has been stored in all the capacitors, the stored input signals $V_i$ are simultaneously transmitted to the input terminals $P_2$ of the differential amplifiers through a plurality of switches equivalent to the switch $S_{12}$. As this occurs, the negative feedback construction of the differential amplifier is in the primary operative state in which the switches $S_{12}$ and $S_{13}$ are on and the switches $S_{14}$ and $S_{15}$ are off, and becomes a circuit connection shown in FIG. 10.

Since in the primary operative state there has been formed the negative feedback circuit in which the inverting input terminal $P_1$ and the output terminal $P_3$ are connected, as described above, an offset voltage $V_{OFF}$ which occurs in the differential amplifier is stored in the hold capacitor $C_{12}$ connected at one end thereof to the inverting input terminal $P_1$ and at the other end to ground, and at this time, the following equations are established:

$$V_i = V_2 = V_1 + V_{OFF} \quad \text{(Eq. 1)}$$

$$V_{C12} = V_1 = V_i - V_{OFF} \quad \text{(Eq. 2)}$$

Thus, the voltage $V_{C12}$ of the capacitor $C_{12}$ becomes a voltage reduced by an amount of the offset voltage from the input signal $V_i$ time-divided by the sample hold circuit.

Figure 11:
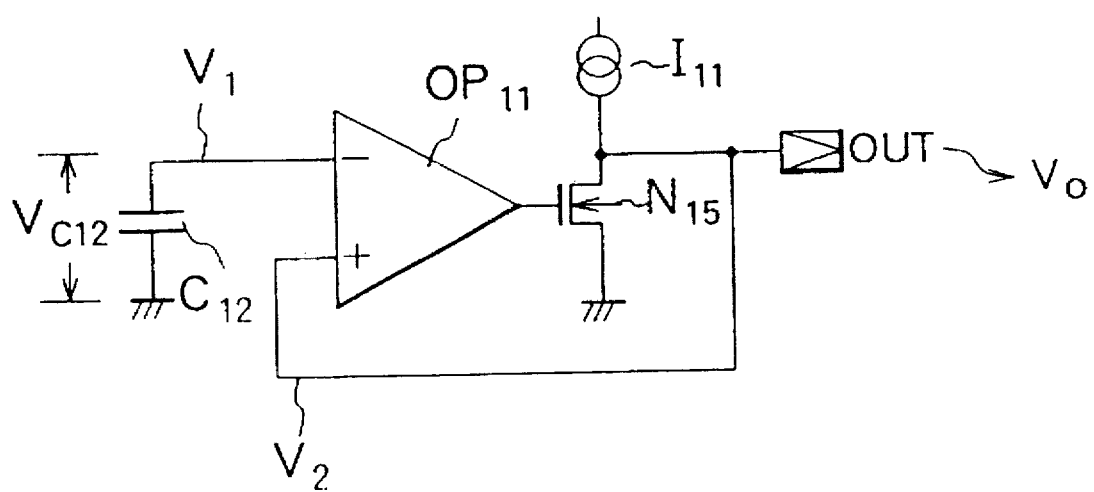
FIG. 11 is a diagram used to explain the operational principles of the liquid crystal drive circuit of FIG. 1.

Next, the negative feedback circuit construction goes to the operative state in which the switches $S_{12}$ and $S_{13}$ are off and the switches $S_{14}$ and $S_{15}$ are on, and becomes a circuit connection shown in FIG. 11.

Because, in the differential amplifier in the secondary operative state, the negative feedback circuit is constructed through the output-polarity inverting buffer circuit $OB_{11}$ constituted by the current source $I_{11}$ and the NMOS transistor $N_{15}$, the output polarity is switched between the differential amplifier output in the primary operative state and the output through the output-polarity inverting buffer circuit in the secondary operative state. The input signal voltage $V_{C12}$ including the offset voltage, stored in the primary operative state in the capacitor $C_{12}$, is again output to the horizontal line pixel of the liquid crystal panel as an output voltage $V_O$ by the output terminal $OUT_i$ through the differential amplifier. As this occurs, between the voltage $V_{C12}$ of the capacitor $C_{12}$ stored during the aforementioned primary operative state and the output voltage $V_O$ of the liquid crystal drive circuit, there is established the relationship expressed by the following equations:

$$V_{C12} + V_{OFF} = V_2 \quad \text{(Eq. 3)}$$

$$V_O = V_2 = V_{C12} + V_{OFF} \quad \text{(Eq. 4)}$$

It is found from Eqs. 2 and 4 that the input signal $V_i$ and the output voltage $V_2$ are equal to each other. Accordingly, in the present invention, the offset voltages of a plurality of differential amplifier incorporated in the liquid crystal drive circuit are corrected independently of the input voltage level. As a result, the reduction in the fluctuations of the output voltages in a plurality of output circuits, the reduction in the area of an IC, and a decreased cost become possible.

Figure 12:
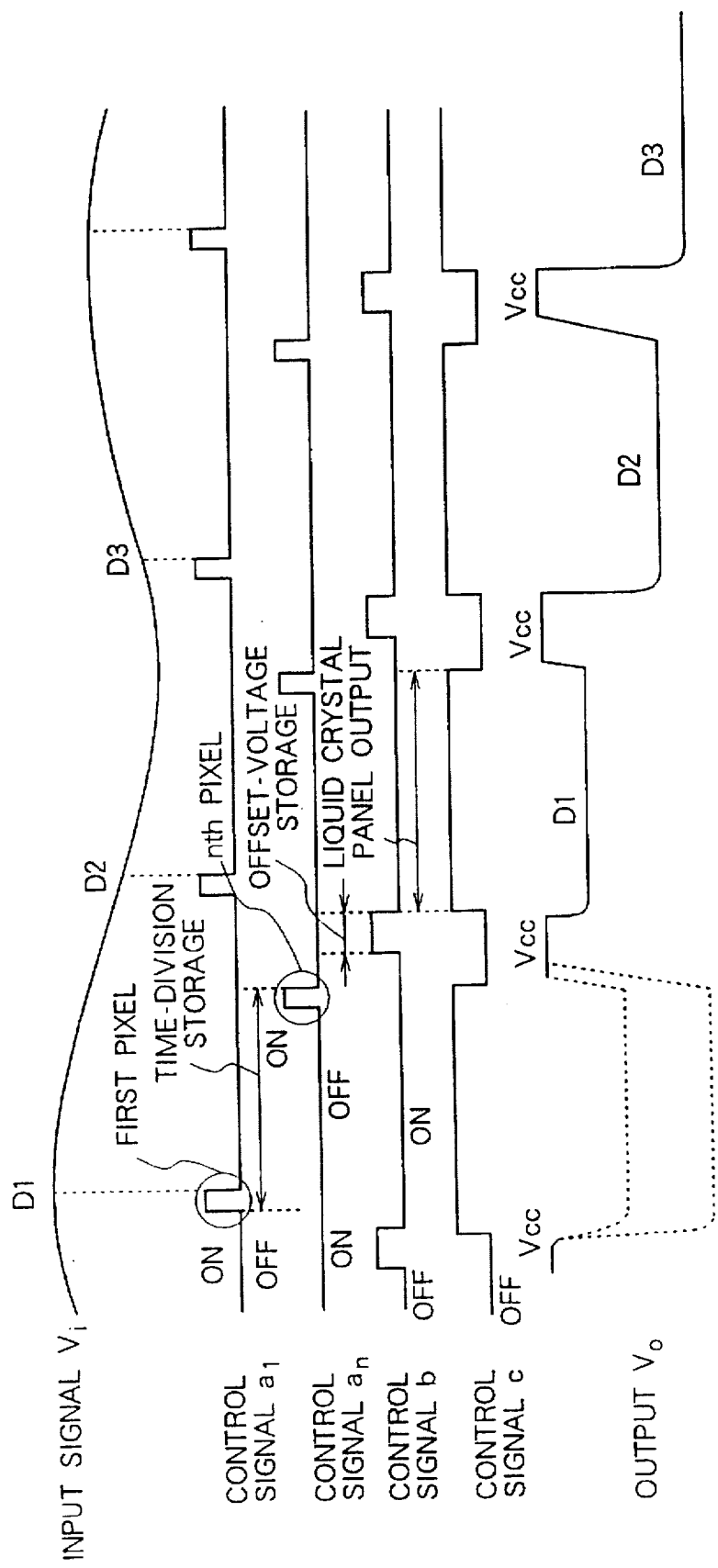
FIG. 12 is a timing chart used to explain the operational principles of the liquid crystal drive circuit of FIG. 1.

The timing chart of FIG. 12 shows the relationship between the input signal $V_i$, the control signal $a_i$ of the switch $S_{11}$, the control signal "b" of the switches $S_{12}$ and $S_{13}$, the control signal "c" of the switches $S_{14}$ and $S_{15}$, and the output signal $V_O$, in the aforementioned operation.

Figure 13:
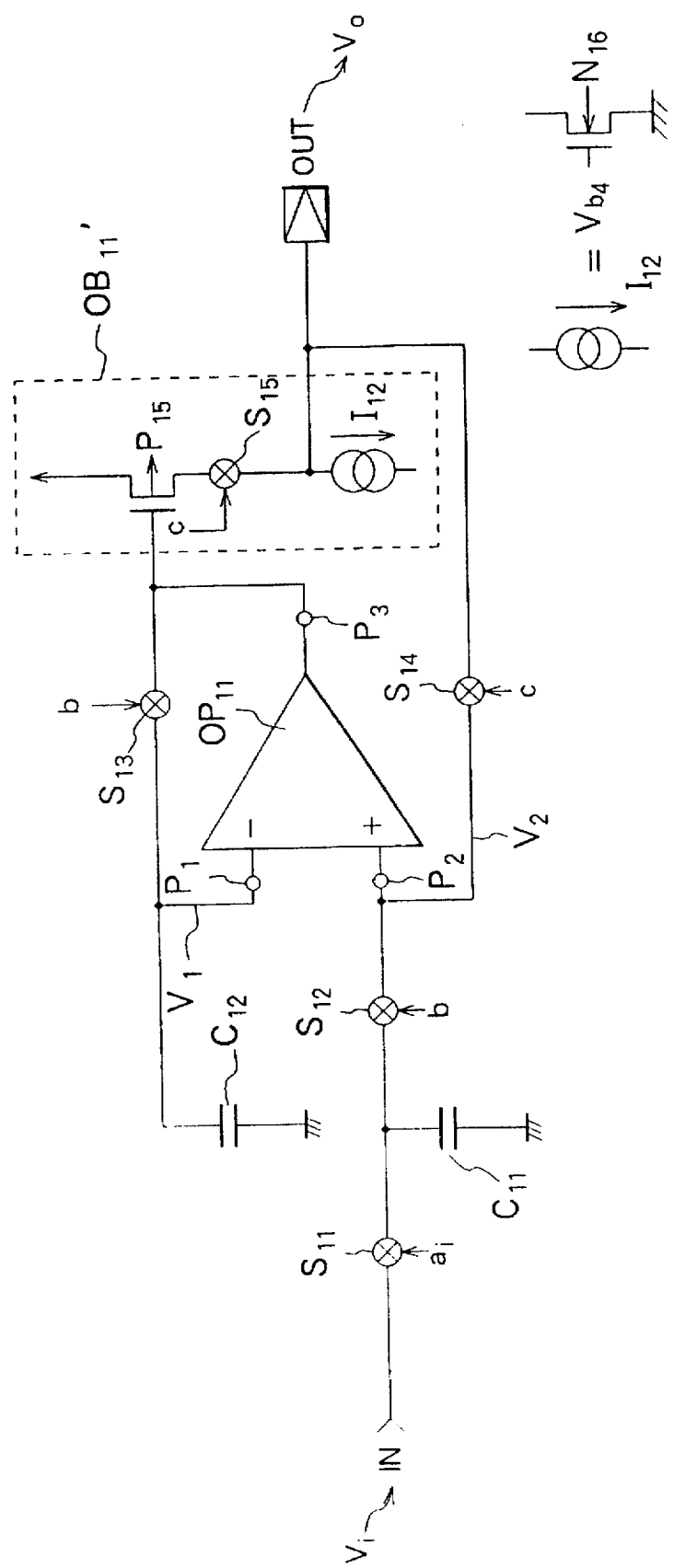
FIG. 13 is a schematic view showing a second embodiment of the present invention.

FIG. 13 illustrates the construction of a second embodiment of the present invention.

The point of difference with the aforementioned first embodiment resides in the construction of an output-polarity inverting buffer circuit $OB_{11}$', and the output-polarity inverting buffer circuit $OB_{11}$' in this embodiment is constituted by a PMOS transistor $P_{15}$ and a current source $I_{12}$. The current source $I_{12}$ comprises an NMOS transistor $N_{16}$ where the gate thereof is given a predetermined bias voltage $V_{b4}$. The other constructions and operations are the same as the first embodiment.

Figure 14:
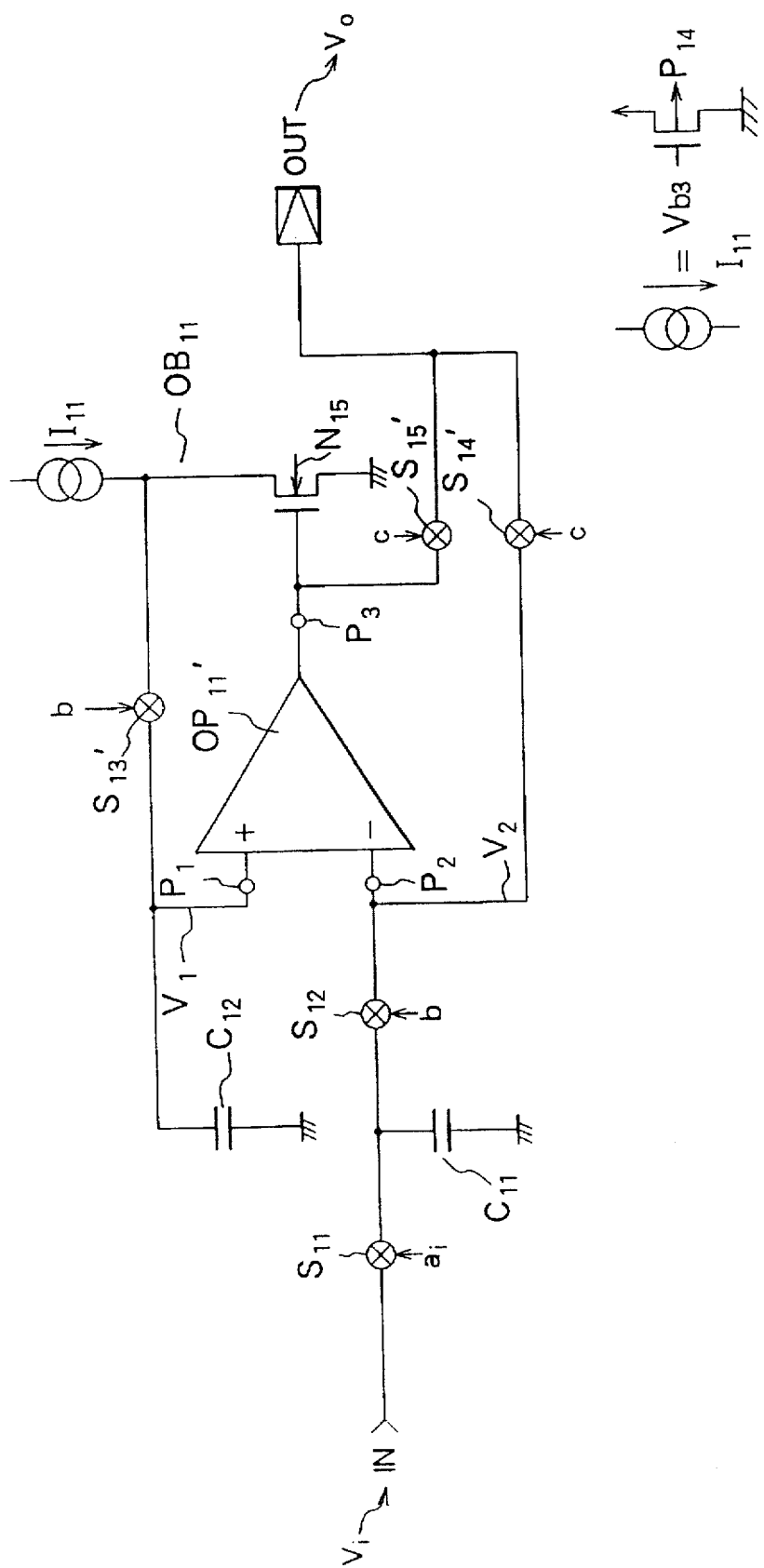
FIG. 14 is a schematic view showing a third embodiment of the present invention.

FIG. 14 illustrates the construction of a third embodiment of the present invention.

The point of difference with the aforementioned first embodiment is that an input signal is input to the inverting input terminal of a differential amplifier $OP_{11}$'. Therefore, in the primary operative state, there is constructed a negative feedback circuit leading from the output of the differential amplifier through an output-polarity inverting buffer circuit $OB_{11}$ and an analog switch $S_{13}$' to the non-inverting input terminal of the differential amplifier $OP_{11}$'. In the secondary operative state, the voltage of an output-voltage storage capacitor $C_{12}$ is input to the non-inverting input terminal of the differential amplifier $OP_{11}$', and there is constructed a negative feedback circuit leading from the output of the differential amplifier through analog switches $S_{15}$' and $S_{14}$' to the inverting input terminal of the differential amplifier $OP_{11}$'. The output of the differential amplifier $OP_{11}$' is output as a liquid crystal drive voltage.

Figure 15:
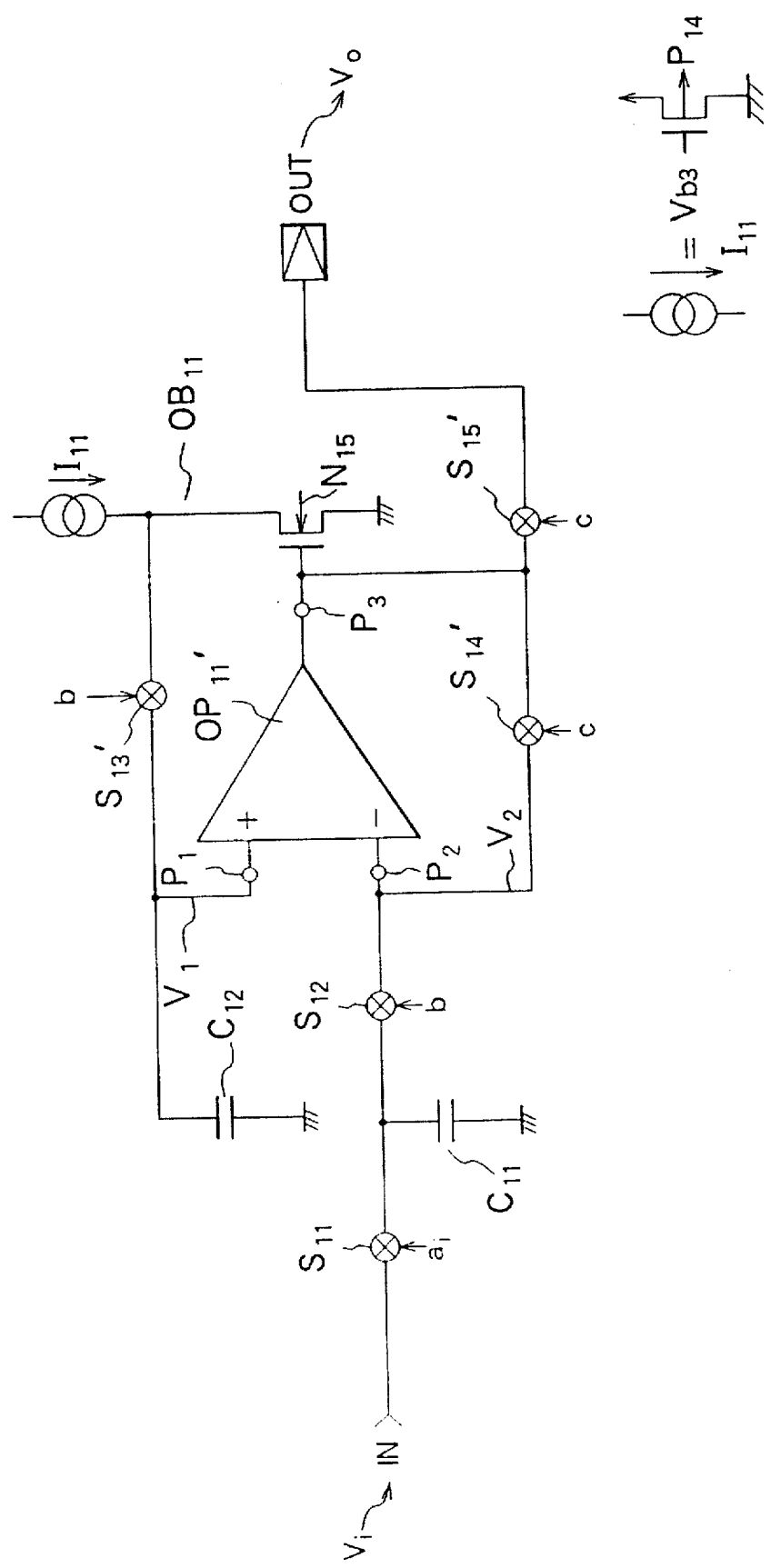
FIG. 15 is a schematic view showing a fourth embodiment of the present invention.

FIG. 15 illustrates the construction of a fourth embodiment of the present invention.

This embodiment is a variation of the aforementioned third embodiment, and the location of the analog switch $S_{14}$' differs.

Figure 16:
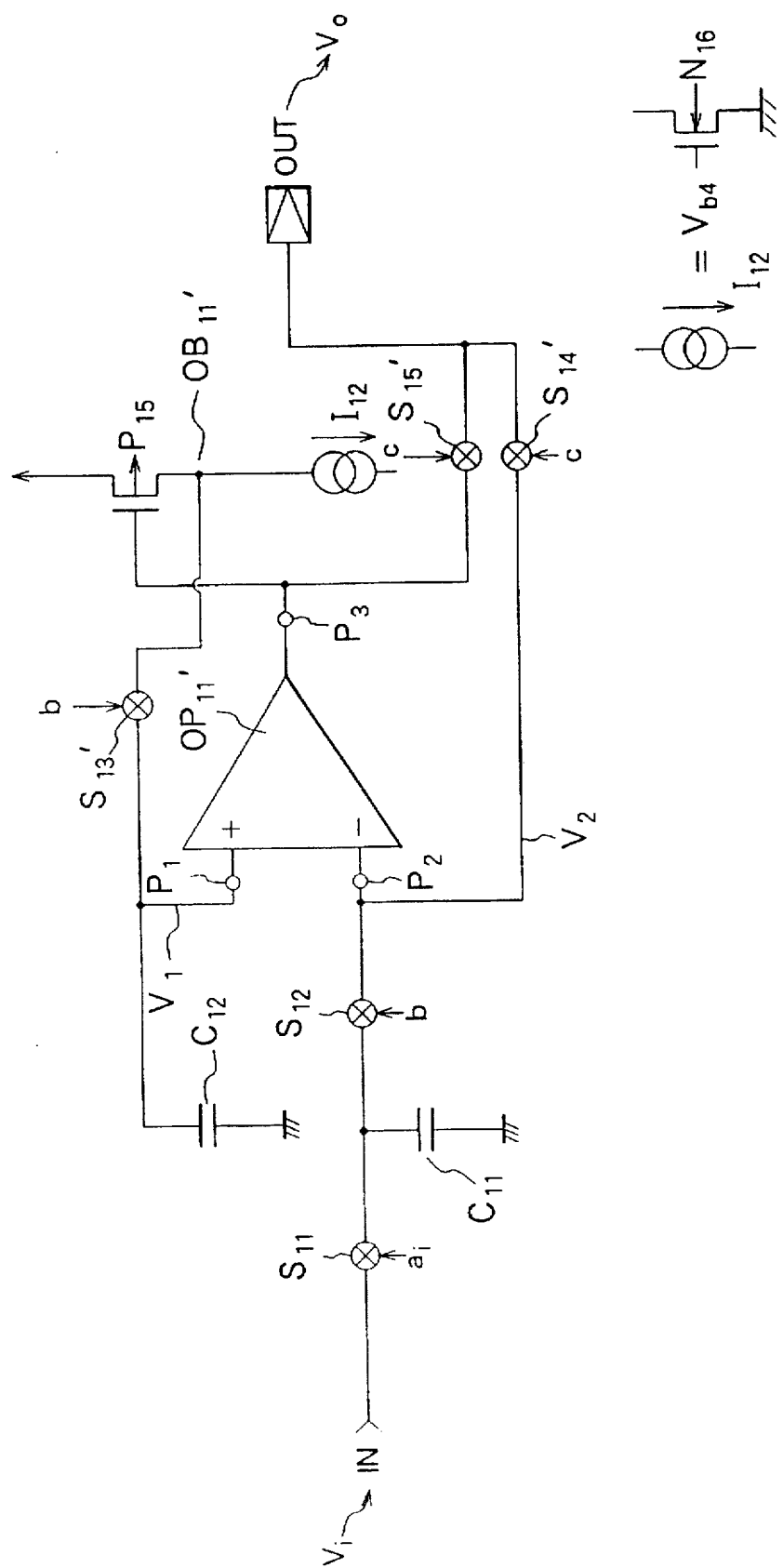
FIG. 16 is a schematic view showing a fifth embodiment of the present invention.

FIG. 16 illustrates the construction of a fifth embodiment of the present invention.

This embodiment is another variation of the aforementioned third embodiment, and the construction of the output-polarity inverting buffer circuit $OB_{11}$' differs.

Figure 17:
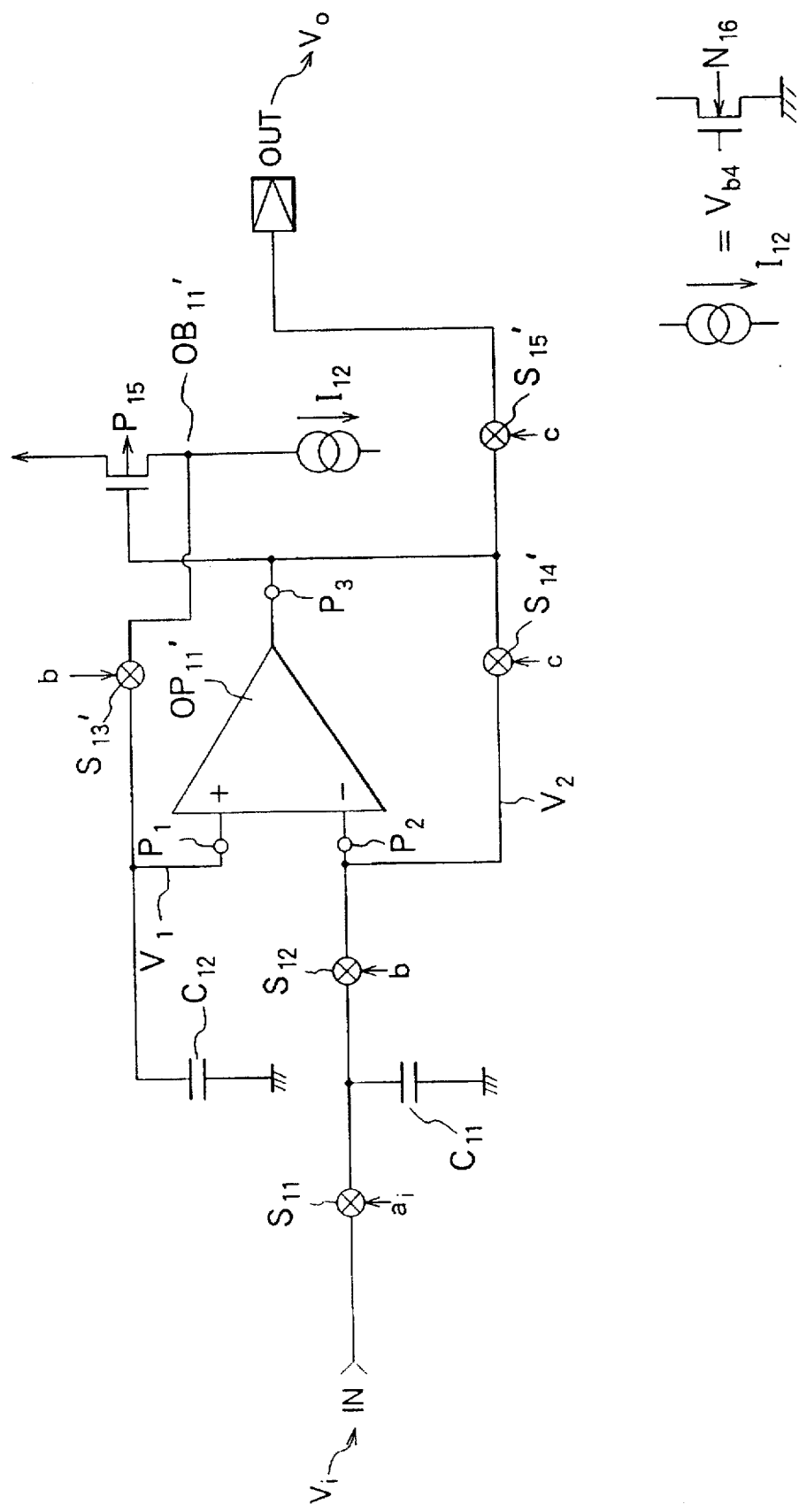
FIG. 17 is a schematic view showing a sixth embodiment of the present invention.

FIG. 17 illustrates the construction of a sixth embodiment of the present invention.

This embodiment is a variation of the aforementioned fourth embodiment, and the construction of the output-polarity inverting buffer circuit $OB_{11}$' differs.

While the present invention has been described with reference to specific embodiments thereof, the invention is not limited to the aforementioned embodiments, and numerous variations and modifications may be constructed without departing from the scope of the present invention. For example, although in the aforementioned embodiments the MOS transistors have been used to constitute the switches and the differential amplifiers, the invention is not limited to the MOS integrated circuits, and J-FET transistors and bipolar transistors may be used within a range in which there is no interference in the operation of the liquid crystal drive circuit. In addition, although in the foregoing description the present invention has been applied to the active matrix liquid crystal drive circuit, the invention is not limited to the field of utilization and it may be applied to various kinds of circuits and apparatuses provided with controllable differential amplifiers.

Many widely different embodiments of the present invention may be constructed without departing from the spirit and scope of the present invention. It should be understood that the present invention is not limited to the specific embodiments described in the specification, except as defined in the appended claims.

What is claimed is:

1. An active matrix liquid crystal drive circuit comprising:
   a sampling capacitor for storing an analog input signal;
   a buffer circuit for inverting a polarity of an input signal thereof;
   a differential amplifier having an inverting input terminal, a non-inverting input terminal and an output terminal connected to an input of said buffer circuit;
   a hold capacitor connected to said inverting terminal of said differential amplifier; and
   switching means, in a first operative state, for connecting said sampling capacitor with said non-inverting input terminal and connecting output terminal of said differential amplifier with said hold capacitor, and in a second operative state, for disconnecting said sampling capacitor with said non-inverting input terminal and connecting an output of said buffer circuit with an output terminal of said liquid crystal drive circuit.

2. An active matrix liquid crystal drive circuit according to claim 1, wherein said buffer circuit includes a current source and a NMOS transistor.

3. An active matrix liquid crystal drive circuit according to claim 1, wherein said differential amplifier includes a PMOS transistor, a NMOS transistor and a switch.

4. An active matrix liquid crystal drive circuit comprising:
   a sampling capacitor for storing an analog input signal;
   a buffer circuit for inverting a polarity of an input signal thereof;
   a differential amplifier having an inverting input terminal, a non-inverting input terminal and an output terminal connected to an input of said buffer circuit;
   a hold capacitor connected to said non-inverting terminal of said differential amplifier; and
   switching means, in a first operative state, for connecting said sampling capacitor with said inverting input terminal and connecting said an output of said buffer circuit with said hold capacitor, and in a second operative state, for disconnecting said sampling capacitor with said inverting input terminal and connecting said output terminal of said differential amplifier with an output terminal of said liquid crystal drive circuit.

5. An active matrix liquid crystal drive circuit according to claim 4, wherein said buffer circuit includes a current source and a PMOS transistor.

6. An active matrix liquid crystal drive circuit according to claim 4, wherein said differential amplifier includes a PMOS transistor, a NMOS transistor and a switch.

* * * * *